United States Patent
Yamazaki

(10) Patent No.: US 12,027,551 B2
(45) Date of Patent: Jul. 2, 2024

(54) IMAGE PICKUP DEVICE

(71) Applicant: SONY SEMICONDUCTOR SOLUTIONS CORPORATION, Kanagawa (JP)

(72) Inventor: Tomohiro Yamazaki, Kumamoto (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 801 days.

(21) Appl. No.: 17/040,394

(22) PCT Filed: Dec. 11, 2018

(86) PCT No.: PCT/JP2018/045399
§ 371 (c)(1),
(2) Date: Sep. 22, 2020

(87) PCT Pub. No.: WO2019/187370
PCT Pub. Date: Oct. 3, 2019

(65) Prior Publication Data
US 2021/0057474 A1   Feb. 25, 2021

(30) Foreign Application Priority Data
Mar. 30, 2018  (JP) ................. 2018-066631

(51) Int. Cl.
*H01L 27/146* (2006.01)
*G02B 5/30* (2006.01)

(52) U.S. Cl.
CPC ...... *H01L 27/14625* (2013.01); *G02B 5/3058* (2013.01); *H01L 27/14621* (2013.01); *H01L 27/14623* (2013.01)

(58) Field of Classification Search
CPC .. H04N 25/70; G02B 5/3058; H01L 27/1462; H01L 27/14621; H01L 27/14623; H01L 27/14625; H01L 27/14627; H01L 27/1463
See application file for complete search history.

(56) References Cited

U.S. PATENT DOCUMENTS

2008/0170143 A1   7/2008  Yoshida
2012/0086094 A1*  4/2012  Watanabe ............ H01L 23/481
                                              257/E31.127
(Continued)

FOREIGN PATENT DOCUMENTS

CN   108028259 A   5/2018
JP   10-073722 A   3/1998
(Continued)

OTHER PUBLICATIONS

International Search Report and Written Opinion of PCT Application No. PCT/JP2018/045399, dated Feb. 12, 2019, 09 pages of ISRWO.

*Primary Examiner* — Lin Ye
*Assistant Examiner* — Chriss S Yoder, III
(74) *Attorney, Agent, or Firm* — CHIP LAW GROUP

(57) ABSTRACT

Transmitted light loss in an image pickup device is reduced in forming an underlying film of optical elements.
The image pickup device includes photoelectric conversion units, optical elements, and an underlying film of the optical elements. The photoelectric conversion units convert incident light into electric signals. The optical elements provide the incident light to the photoelectric conversion units. The underlying film of the optical elements is provided in a region between a first open region and a second open region of the optical elements in a layer between the optical elements and the photoelectric conversion units. Furthermore, the underlying film of the optical elements may be (Continued)

provided in a light-shielding region and a contact region outside an effective pixel region.

12 Claims, 11 Drawing Sheets

(56) References Cited

U.S. PATENT DOCUMENTS

| | | | | |
|---|---|---|---|---|
| 2012/0319222 | A1* | 12/2012 | Ozawa | H01L 27/14605 |
| | | | | 257/E31.127 |
| 2016/0254303 | A1* | 9/2016 | Takimoto | G02B 5/20 |
| | | | | 257/432 |
| 2018/0286908 | A1 | 10/2018 | Yamazaki et al. | |

FOREIGN PATENT DOCUMENTS

| | | |
|---|---|---|
| JP | 2008-177191 A | 7/2008 |
| JP | 2017-076683 A | 4/2017 |
| KR | 10-2018-0068953 A | 6/2018 |
| WO | 2017/064844 A1 | 4/2017 |

\* cited by examiner

IMAGE PICKUP DEVICE

CROSS REFERENCE TO RELATED APPLICATIONS

This application is a U.S. National Phase of International Patent Application No. PCT/JP2018/045399 filed on Dec. 11, 2018, which claims priority benefit of Japanese Patent Application No. JP 2018-066631 filed in the Japan Patent Office on Mar. 30, 2018. Each of the above-referenced applications is hereby incorporated herein by reference in its entirety.

TECHNICAL FIELD

The present technology relates to an image pickup device. Specifically, the present technology relates to an image pickup device with optical elements provided on the incident light side.

BACKGROUND ART

In image pickup devices in which optical elements are integrated, a barrier metal is sometimes formed as an underlying film in order to prevent diffusion or mutual reaction of the metallic material of the optical elements, to strengthen adhesion to a substrate, to prevent stress migration of the metallic material, and so on. For example, an image pickup device has been proposed in which a barrier metal containing titanium as a metallic material is formed as an underlying film of wire grid polarizers (see Patent Document 1, for example).

CITATION LIST

Patent Document

Patent Document 1: Japanese Patent Application Laid-Open No. 2017-076683

SUMMARY OF THE INVENTION

Problems to be Solved by the Invention

In the above-mentioned conventional technology, forming the barrier metal as the underlying film of the wire grid polarizers can provide effects such as the prevention of diffusion and mutual reaction of the metallic material, the strengthening of adhesion to the substrate, the prevention of stress migration of the metallic material, and so on. However, a material used as a barrier metal is difficult to process, and generally has a larger processing conversion difference than the metallic material of optical elements, resulting in a shape projecting to the metallic material. A material used as a barrier metal is opaque, and thus a projected barrier metal causes attenuation of transmission axis light.

The present technology has been invented in view of such circumstances, and an object thereof is to reduce transmitted light loss in an image pickup device in forming an underlying film of optical elements.

Solutions to Problems

The present technology has been made to solve the above-described problem, and a first aspect thereof is an image pickup device including photoelectric conversion units that convert incident light into electric signals, optical elements that provide the incident light to the photoelectric conversion units, and an underlying film of the optical elements provided in a region between a first open region and a second open region of the optical elements in a layer between the optical elements and the photoelectric conversion units. This provides the effect of forming the underlying film in the region between the open regions while transmitting light in the open regions.

Furthermore, in the first aspect, the underlying film may be a barrier metal. This provides the effects of preventing diffusion and mutual reaction of metallic material and so on.

Furthermore, in the first aspect, the underlying film may be formed using a single metallic material, or may be formed using a laminated metal film.

Furthermore, in the first aspect, the underlying film may be further provided in a light-shielding region outside an effective pixel region of the photoelectric conversion units, and may be further provided in a contact region outside the effective pixel region of the photoelectric conversion units.

Furthermore, in the first aspect, the optical elements may be wire grid polarizers. The wire grid polarizers may be formed using a single metallic material, or may be formed using a laminated film of a plurality of metallic materials. Furthermore, the wire grid polarizers may be formed using a laminated film of a plurality of metallic materials and an insulator material.

Furthermore, in the first aspect, the optical elements may be color filters utilizing surface plasmon resonance.

Furthermore, a second aspect of the present technology is an image pickup device including photoelectric conversion units that convert incident light into electric signals, optical elements that provide the incident light to the photoelectric conversion units, and an underlying film of the optical elements provided in a light-shielding region outside an effective pixel region of the photoelectric conversion units in a layer between the optical elements and the photoelectric conversion units. This provides the effect of further improving the light-shielding characteristic.

Furthermore, a third aspect of the present technology is an image pickup device including photoelectric conversion units that convert incident light into electric signals, optical elements that provide the incident light to the photoelectric conversion units, and an underlying film of the optical elements provided in a contact region outside an effective pixel region of the photoelectric conversion units in a layer between the optical elements and the photoelectric conversion units. This provides the effect of preventing diffusion and mutual reaction of metallic material.

Effects of the Invention

The present technology can provide the excellent effect of being able to reduce transmitted light loss in an image pickup device in forming an underlying film of optical elements. Note that the effect described here is not necessarily limiting, and any effect described in the present disclosure may be included.

MODE FOR CARRYING OUT THE INVENTION

Hereinafter, a mode for carrying out the present technology (hereinafter referred to as an embodiment) will be described. The description will be made in the following order.

1. Embodiment (an example of a polarization sensor using wire grid polarizers)
2. Modification (an example of an application to a plasmon filter)

1. Embodiment

[Imaging Device]

Figure 1:
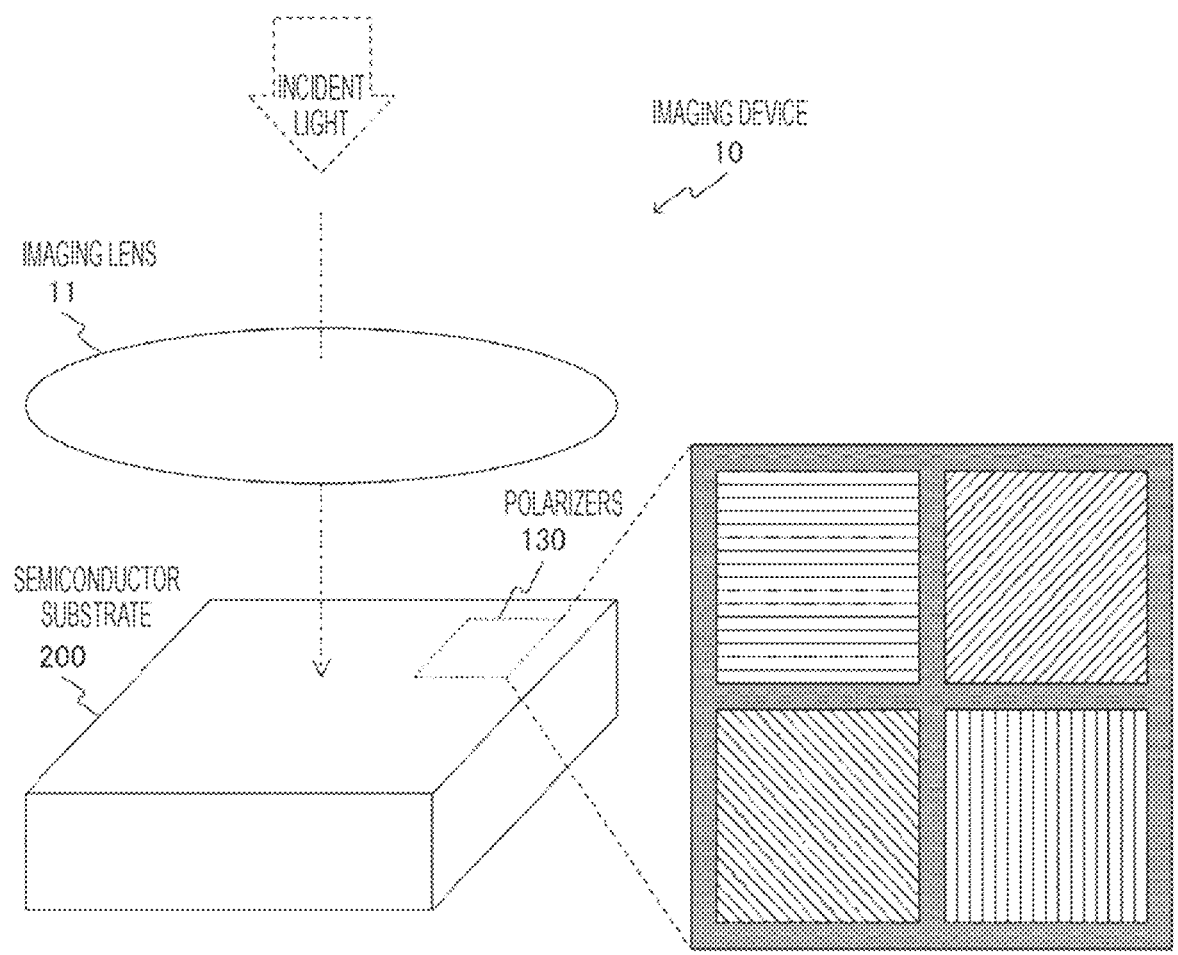
FIG. 1 is a diagram showing an example of an external appearance of an imaging device 10 according to an embodiment of the present technology.

FIG. 1 is a diagram showing an example of an external appearance of an imaging device 10 according to an embodiment of the present technology.

The imaging device 10 includes an imaging lens 11 on the incident light side of a semiconductor substrate 200 including photoelectric conversion units. The semiconductor substrate 200 is a semiconductor substrate including, for example, silicon (Si) as a material. Furthermore, polarizers 130 are provided on the incident light side of the semiconductor substrate 200.

The imaging lens 11 is a lens for forming an image from a subject on an image plane in the imaging device 10.

The polarizers 130 are optical elements that generate polarization information of a subject. By integrating the polarizers 130 having a plurality of polarization directions on the semiconductor substrate 200 by a wafer process, the imaging device 10 acquires polarization information of a subject by one-time imaging. In this embodiment, it is assumed that the polarizers 130 are wire grid polarizers (WGPs). Note that the polarizers 130 are an example of optical elements described in the claims.

Figure 2:
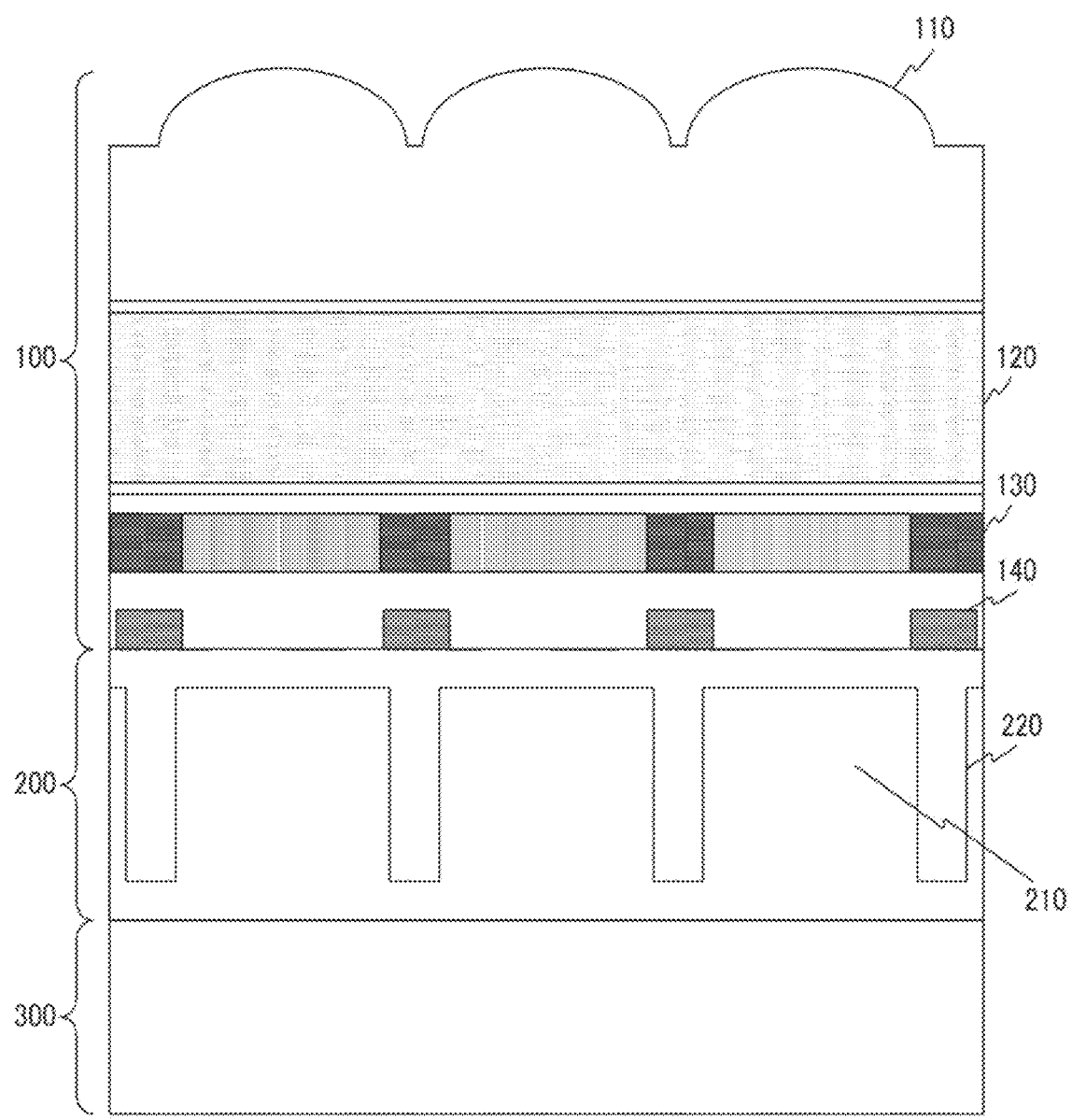
FIG. 2 is a diagram showing an example of a cross-sectional view of a polarization sensor as an example of an image pickup device according to the embodiment of the present technology.

FIG. 2 is a diagram showing an example of a cross-sectional view of a polarization sensor as an example of an image pickup device according to the embodiment of the present technology.

In the polarization sensor, photodiodes 210 are provided in portions demarcated by trenches 220 inside the semiconductor substrate 200. Each photodiode 210 is provided with an n-type doped region as a charge storage region. Each photodiode 210 is formed as an n-type doped region in a region sandwiched between P-type semiconductor regions in the depth direction of the semiconductor substrate 200. Note that the photodiodes 210 are an example of photoelectric conversion units described in the claims.

Pixel transistors (not shown) are provided on the front side of the semiconductor substrate 200 (a lower part in the figure). A wiring layer 300 is provided so as to cover these pixel transistors. In the wiring layer 300, wiring is formed so that it is covered by an insulating layer.

On the other hand, the polarizers 130 and on-chip lenses 110 are provided on the back side of the semiconductor substrate 200 (an upper part in the figure). An insulating film that is a silicon oxide film and a planarizing film 120 are formed between the polarizers 130 and the on-chip lenses 110.

Incident light incident from the back side is received by the photodiode 210 of each pixel. The photodiode 210 generates an electric charge corresponding to the incident light. A light-shielding film 140 is formed below the trenches 220 between the pixels. The light-shielding film 140 is formed using a light-shielding material such as metal.

[Wire Grid Polarizer]

Figure 3:
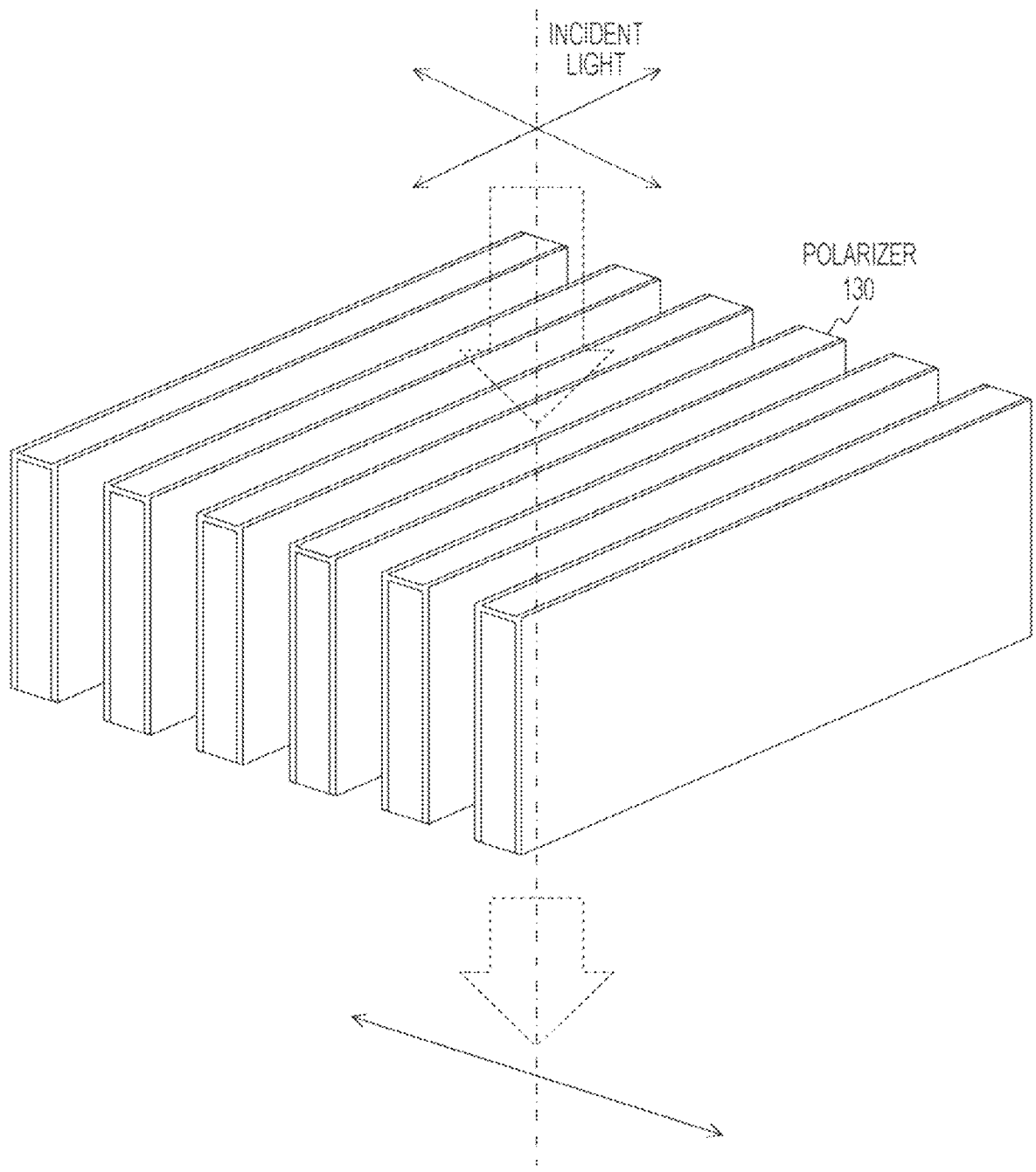
FIG. 3 is a diagram showing an example of an external appearance of a wire grid polarizer as an example of a polarizer 130 according to the embodiment of the present technology.

FIG. 3 is a diagram showing an example of an external appearance of a wire grid polarizer as an example of each polarizer 130 according to the embodiment of the present technology.

The wire grid polarizer is metal processed into the form of fine wires with a pitch smaller than or equal to the wavelength of light. The wire grid polarizer reflects, of incident light, polarized light parallel to lines (extinction axis light), and transmits polarized light perpendicular to the lines (transmission axis light). Thus, it functions as a polarizer that transmits only light in a specific direction. Compared with a resin polarizer, the wire grid polarizer has characteristics including a higher extinction ratio, a higher heat resistance, and applicability to a wider wavelength range.

Figure 4:
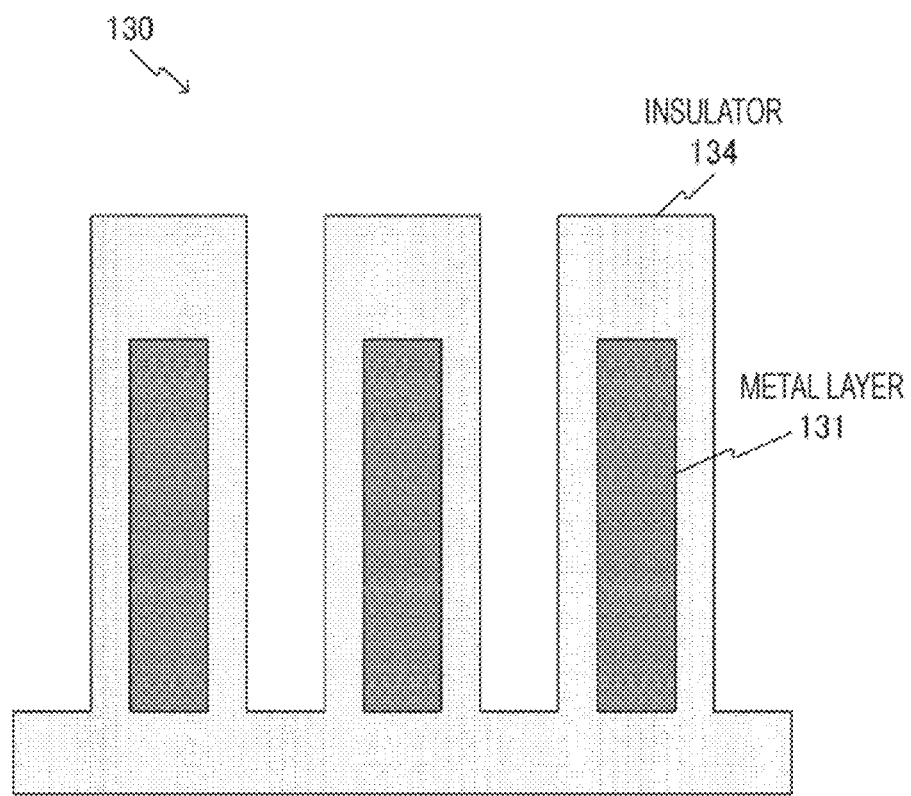
FIG. 4 is a diagram showing a cross section of a first example of the wire grid polarizer according to the embodiment of the present technology.

FIG. 4 is a diagram showing a cross section of a first example of the wire grid polarizer according to the embodiment of the present technology. The first example of the wire grid polarizer includes a metal layer 131, and is entirely covered with an insulator 134.

The metal layer 131 can be formed using, for example, a single metal such as aluminum (Al), copper (Cu), platinum (Pt), silver (Ag), tungsten (W), titanium (Ti), or tantalum (Ta). Alternatively, the metal layer 131 may be formed using a metal film in which these metals are laminated.

The insulator 134 is a dielectric that is transparent to incident light and does not have a light absorption characteristic, and can be formed using, for example, the silicon alloy material $SiO_2$, SiN, or SiC, AlO, or the like.

Figure 5:
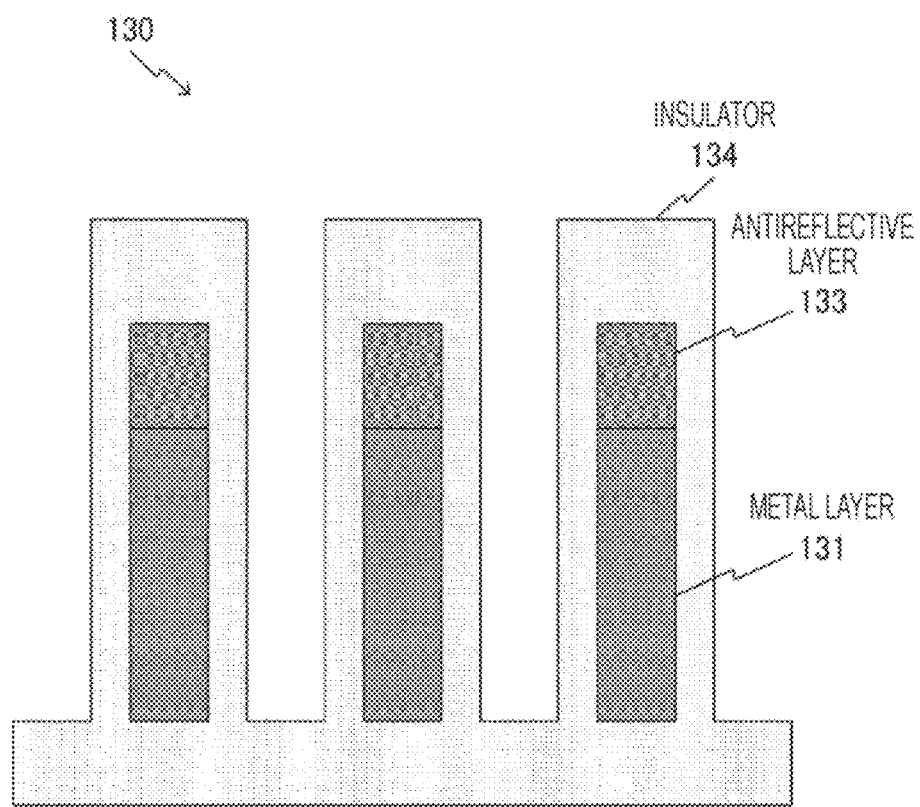
FIG. 5 is a diagram showing a cross section of a second example of the wire grid polarizer according to the embodiment of the present technology.

FIG. 5 is a diagram showing a cross section of a second example of the wire grid polarizer according to the embodiment of the present technology. The second example of the wire grid polarizer includes an antireflective layer 133 formed on the entire top surface of the metal layer 131 in addition to the metal layer 131 of the first example, and is entirely covered with the insulator 134.

The antireflective layer 133 is a metallic material or an alloy material having a light absorption action, and can be formed using, for example, a single metal such as aluminum (Al), copper (Cu), platinum (Pt), silver (Ag), tungsten (W), titanium (Ti), or tantalum (Ta). Alternatively, the antireflective layer 133 may be formed using a metal film in which these metals are laminated.

Figure 6:
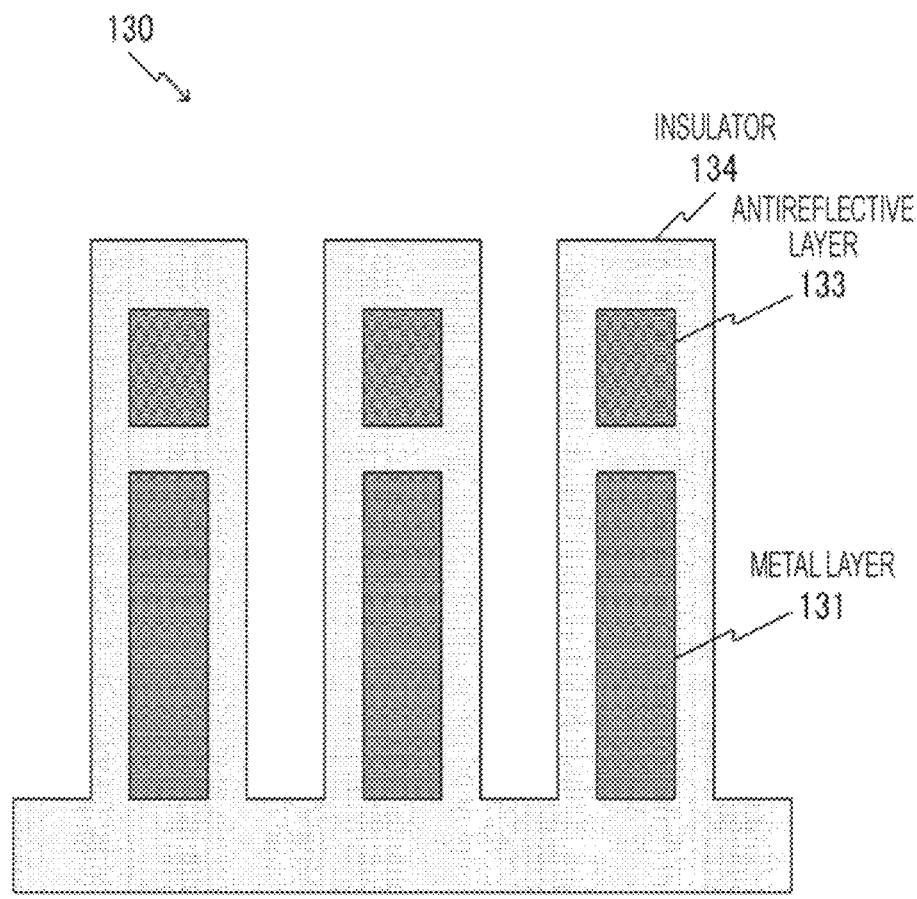
FIG. 6 is a diagram showing a cross section of a third example of the wire grid polarizer according to the embodiment of the present technology.

FIG. 6 is a diagram showing a cross section of a third example of the wire grid polarizer according to the embodiment of the present technology. The third example of the wire grid polarizer has a configuration in which the insulator 134 is sandwiched between the metal layer 131 and the antireflective layer 133 in the second example, and is entirely covered with the insulator 134. That is, the wire grid polarizer of the third example is formed using a laminated film of a plurality of metallic materials and a dielectric material.

[Barrier Metal]

Figure 7:
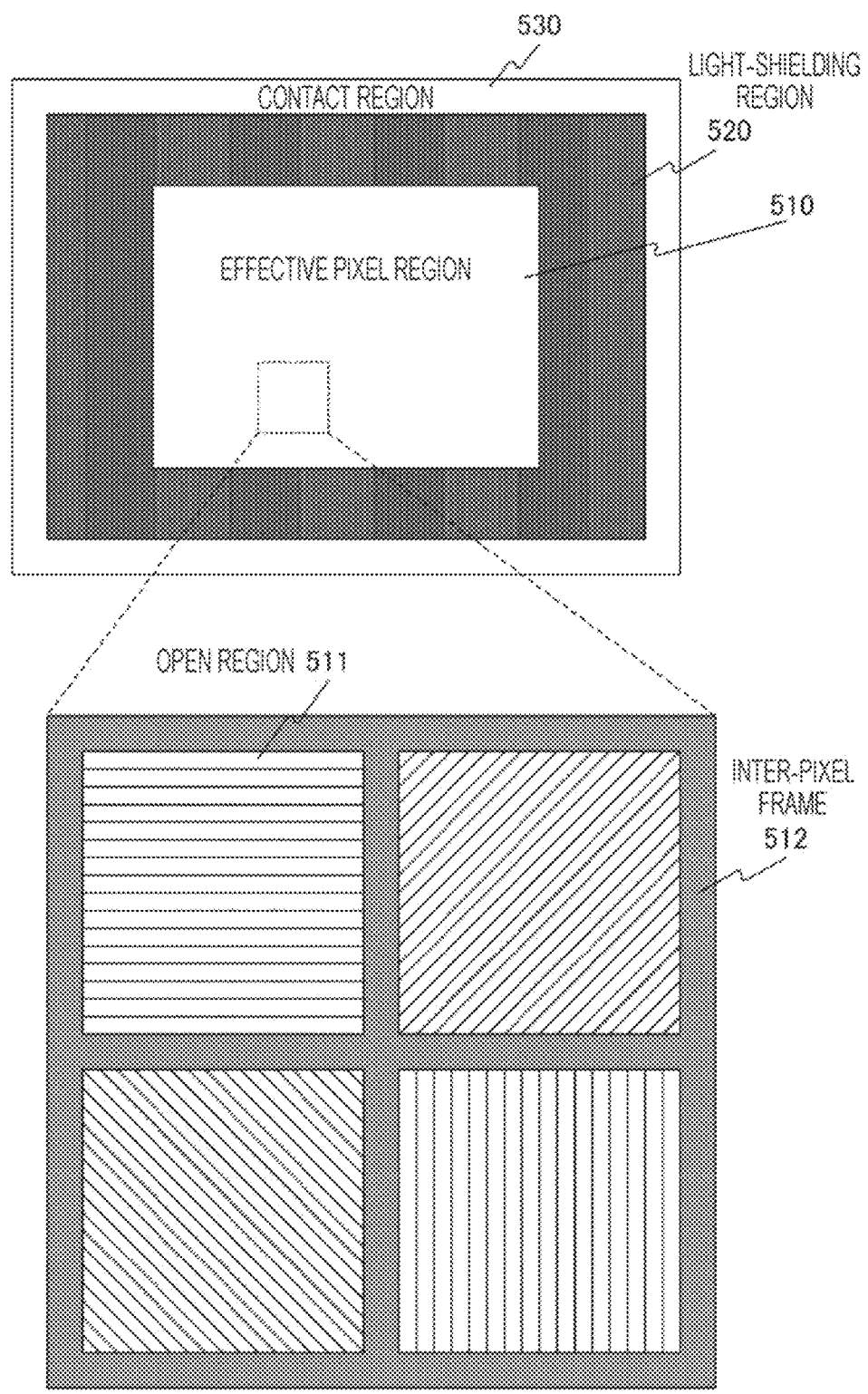
FIG. 7 is a diagram showing an example of regions where a barrier metal is disposed according to the embodiment of the present technology.

FIG. 7 is a diagram showing an example of regions where a barrier metal is disposed according to the embodiment of the present technology.

The region in the plane of the polarization sensor according to the embodiment includes an effective pixel region 510 in the center, a light-shielding region 520 around the effective pixel region 510, and further a contact region 530 around the perimeter of the light-shielding region 520.

The effective pixel region 510 is a region in which pixels including the photodiodes 210 are disposed in an array. The light-shielding region 520 is a light-shielding pixel region for detecting dark current components of pixel output. The contact region 530 is a region connected to the semiconductor substrate 200 around the perimeter of the light-shielding region 520.

In the effective pixel region 510, open regions 511 area formed at positions corresponding to pixels so as to transmit light. In the embodiment, the wire grid polarizers are disposed as optical elements in the open regions 511. On the other hand, an inter-pixel frame 512 is formed between the pixels in the effective pixel region 510, to which a light-shielding film called a black matrix is provided to prevent color mixture and the like between the pixels.

In this embodiment, in each of these regions, the barrier metal is not laid in portions through which light is transmitted, and the barrier metal is laid only in regions through which light is not transmitted. This makes it possible to improve transmitted light loss while enjoying the advantages of laying the barrier metal.

Here, one of the advantages of laying the barrier metal is the prevention of stress migration. Here, stress migration is a creep phenomenon of metal ions due to wiring stress. This stress migration can cause the possibility that a void may grow in the wiring or a connection portion, resulting in an open failure.

Common diffusion models of polycrystalline metal include body diffusion, grain boundary diffusion, and surface diffusion. Body diffusion has the largest diffusion coefficient, followed by grain boundary diffusion, and surface diffusion. The grain size of a bulk metal is about several microns to 1000 microns, and the grain boundary area is larger than the surface area. It is necessary to fully consider the grain boundary diffusion.

In a case where metal functions as an optical element, it is processed to a size of the order of the wavelength of light (submicron), which is smaller than the grain size, so that body diffusion becomes predominant, and the diffusion coefficient becomes smaller than that in the bulk. That is, in the regions of the optical elements through which light is transmitted, the risk of stress migration occurrence is lower than that of the bulk metal even without the barrier metal. In this embodiment, the barrier metal is not disposed in the light transmission regions (open regions 511) of the optical elements, but the risk of stress migration occurrence is low.

For the metallic material having an area larger than the grain size as in the light-shielding region 520, the grain boundary diffusion is predominant, and thus stress migration is more likely to occur than in the light transmission regions of the optical elements. In this embodiment, a measure against stress migration is taken by disposing the barrier metal in the light-shielding region 520 where stress migration is likely to occur.

A specific measure in this embodiment is as follows.

First, in the inter-pixel frame 512, it is not necessary to transmit light, and thus the barrier metal is laid. This can prevent stress migration. Further, by laying the barrier metal in the inter-pixel frame 512, the light-shielding characteristic can be improved.

In the open regions 511, it is necessary to transmit light to the pixels, and thus the barrier metal is not laid. Consequently, the transmission axis transmittance can be improved as compared with the case where the barrier metal is laid. Furthermore, it is considered that in the wire grid polarizers, the line width of the metal layer 131 corresponding to wires is small, and thus characteristic variations due to stress migration are unlikely to occur even without laying the barrier metal.

In the light-shielding region 520, it is not necessary to transmit light, and thus the barrier metal is laid. This can prevent stress migration. Furthermore, by laying the barrier metal in the light-shielding region 520, the light-shielding characteristic can be improved. Then, optical signal components that become noise can be attenuated.

In the contact region 530, it is not necessary to transmit light, and thus the barrier metal is laid. This can prevent stress migration. Furthermore, by laying the barrier metal in the contact region 530, it is possible to avoid direct contact between the metal layer 131 and the semiconductor substrate 200. This can prevent the main metallic material of the metal layer 131 from diffusing into the semiconductor substrate 200.

Figure 8:
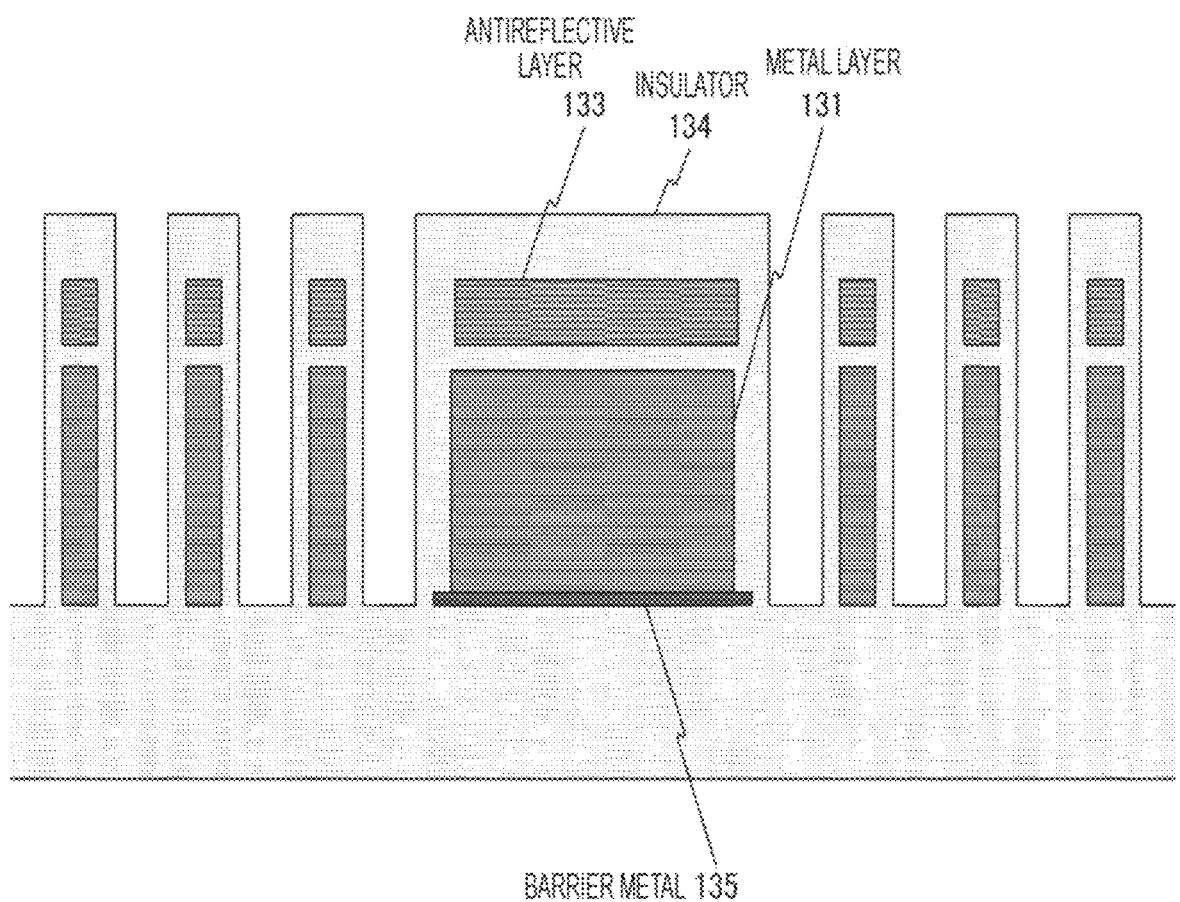
FIG. 8 is a diagram showing an example of a cross-sectional view of and around an inter-pixel frame 512 according to the embodiment of the present technology.

FIG. 8 is a diagram showing an example of a cross-sectional view of and around the inter-pixel frame 512 according to the embodiment of the present technology.

As described above, in the inter-pixel frame 512, the barrier metal 135 is disposed as the underlying layer of the metal layer 131. On the other hand, in the open regions 511, the barrier metal 135 is not disposed, and the lower surface of the metal layer 131 is in contact with the insulator 134. Consequently, it is possible to enjoy the respective advantages for the regions. Note that the barrier metal 135 is an example of an underlying film described in the claims.

The barrier metal 135 can be formed using, for example, a single metal such as titanium (Ti), titanium nitride (TiN), tantalum (Ta), tantalum nitride (TaN), or tungsten (W). Alternatively, the barrier metal 135 may be formed using a metal film in which these metals are laminated, such as Ti/TiN or Ta/TaN.

Figure 9:
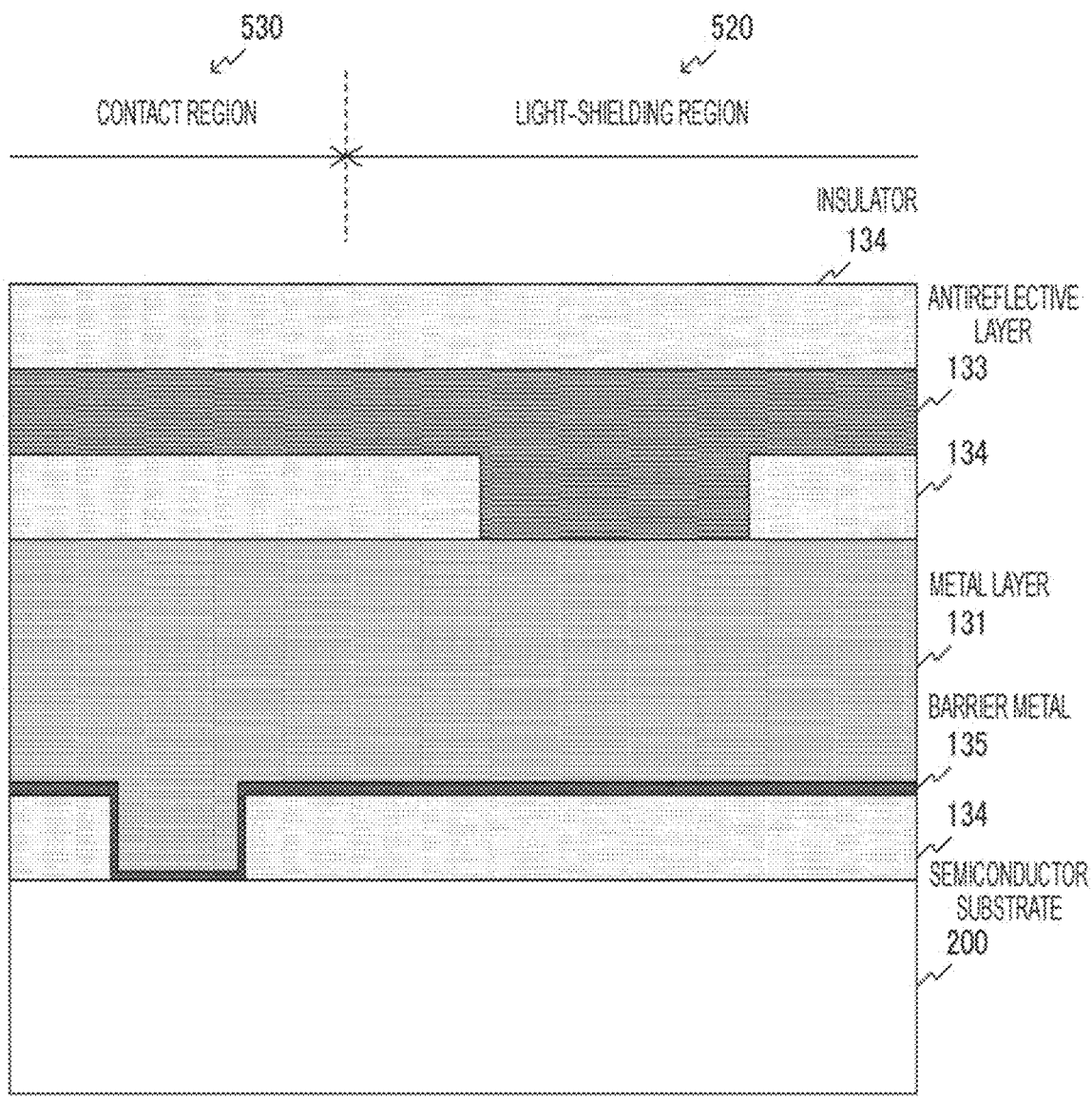
FIG. 9 is a diagram showing an example of a cross-sectional view of a light-shielding region 520 and a contact region 530 according to the embodiment of the present technology.

FIG. 9 is a diagram showing an example of a cross-sectional view of the light-shielding region 520 and the contact region 530 according to the embodiment of the present technology.

As described above, in the light-shielding region 520 and the contact region 530, the barrier metal 135 is disposed as the underlying layer of the metal layer 131. Consequently, in the light-shielding region 520, the light-shielding characteristic can be further improved. Furthermore, in the contact region 530, the main metallic material of the metal layer 131 can be prevented from diffusing into the semiconductor substrate 200.

Thus, according to the embodiment of the present technology, by laying the barrier metal 135 as the underlying layer of the metal layer 131 in the regions where it is not necessary to transmit light, required transmittance can be improved while advantages such as the prevention of diffusion and mutual reaction of the metallic material are enjoyed.

2. Modification

In the above-described embodiment, the example using the wire grid polarizers as the optical elements has been described. Optical elements for which laying a barrier metal is advantageous are not limited to this. In this modification, an example of an application to plasmon filters as optical elements will be described.

[Plasmon Filter]

Figure 10:
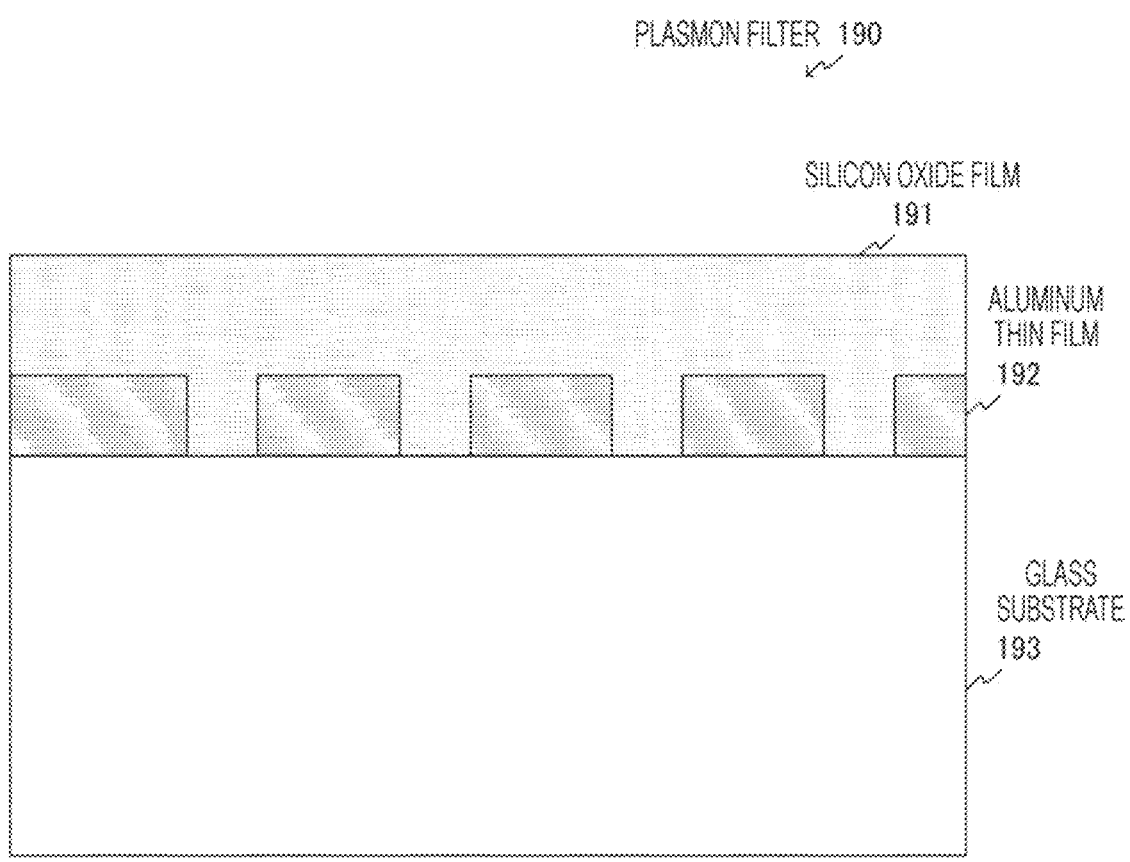
FIG. 10 is a diagram showing an example of a cross-sectional view of a plasmon filter 190 according to a modification of the embodiment of the present technology.

FIG. 10 is a diagram showing an example of a cross-sectional view of a plasmon filter 190 according to a modification of the embodiment of the present technology.

A plasmon filter is a color filter utilizing surface plasmon resonance. The plasmon filter has a structure in which a periodic hole array of about half a light wavelength is formed in a metal thin film on an oxide film, and is further covered with an oxide film. This allows it to function as a color filter that excites surface plasmons having a specific frequency component determined by the period of the hole array at an interface between the metal and the oxide film, and propagates them.

In the figure, an example of a structure is shown in which an aluminum thin film 192 having a hole array with a diameter of about 100 to 200 nanometers is formed on a glass substrate 193 and covered with a silicon oxide film ($SiO_2$) 191.

Figure 11:
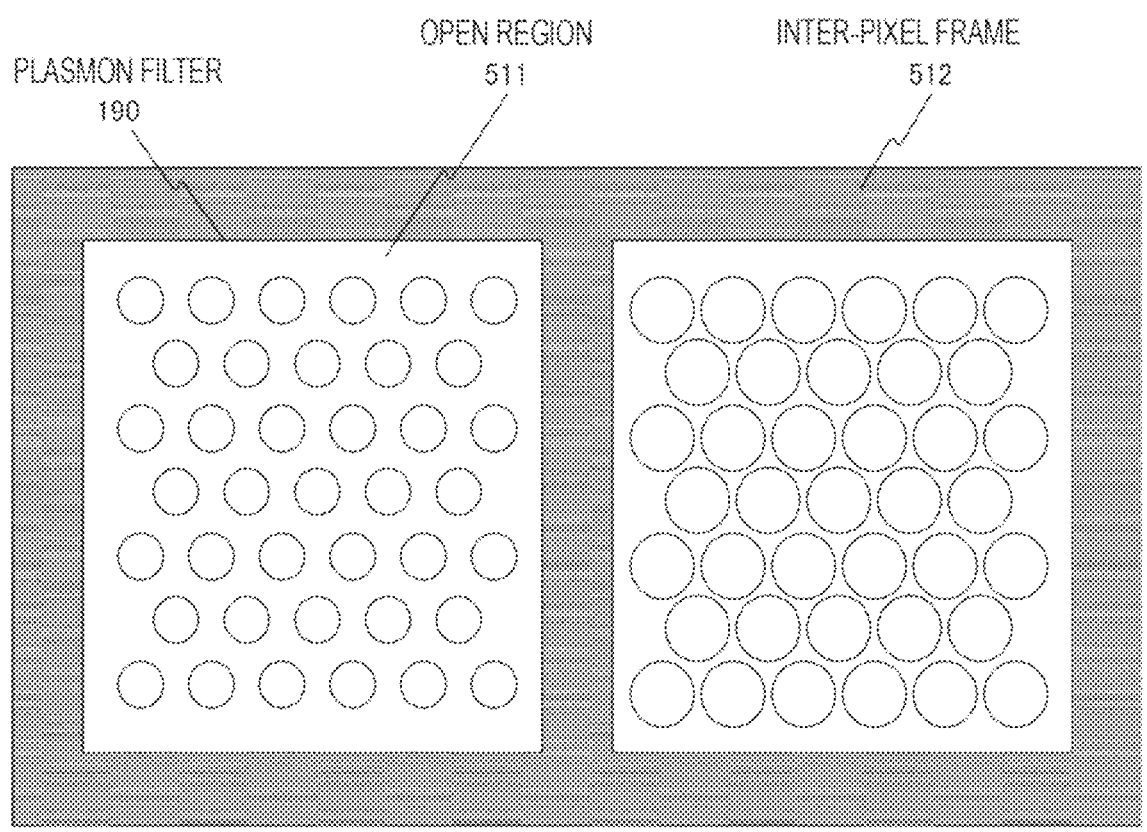
FIG. 11 is a diagram showing an example of a plan view in a case of application to the plasmon filters 190 as the modification of the embodiment of the present technology.

FIG. 11 is a diagram showing an example of a plan view in a case of application to the plasmon filters 190 as the modification of the embodiment of the present technology.

In a case where the plasmon filters 190 are used, light is transmitted in the open regions 511, and light is not transmitted in the inter-pixel frame 512, as is the case with the above-described wire grid polarizers. Thus, a measure is taken in which a barrier metal is laid in the inter-pixel frame 512 and the barrier metal is not laid in the open regions 511. Furthermore, as described in the above-described embodiment, the barrier metal is laid in the light-shielding region 520 and the contact region 530. Note that the plasmon filters 190 are an example of the optical elements described in the claims.

Consequently, in a case where plasmon filters are used as optical elements, effects similar to those of the wire grid polarizers described above can also be obtained.

Note that the above-described embodiment shows an example for embodying the present technology, and matters in the embodiment and matters specifying the invention in the claims have the respective correspondence relationships. Likewise, matters specifying the invention in the claims and matters to which the same names as these are assigned in the embodiment of the present technology have the respective correspondence relationships. However, the present technology is not limited to the embodiment, and can be embodied by making various modifications to the embodiment without departing from the scope thereof.

Note that the effects described in the present description are merely examples and non-limiting, and other effects may be included.

Note that the present technology can also take the following configurations.

(1) An image pickup device including:
photoelectric conversion units that convert incident light into electric signals;
optical elements that provide the incident light to the photoelectric conversion units; and
an underlying film of the optical elements provided in a region between a first open region and a second open region of the optical elements in a layer between the optical elements and the photoelectric conversion units.

(2) The image pickup device according to (1) above, in which the underlying film is a barrier metal.

(3) The image pickup device according to (1) or (2) above, in which the underlying film is formed using a single metallic material.

(4) The image pickup device according to (1) or (2) above, in which the underlying film is formed using a laminated metal film.

(5) The image pickup device according to any one of (1) to (4) above, in which the underlying film is further provided in a light-shielding region outside an effective pixel region of the photoelectric conversion units.

(6) The image pickup device according to any one of (1) to (5) above, in which the underlying film is further provided in a contact region outside an effective pixel region of the photoelectric conversion units.

(7) The image pickup device according to any one of (1) to (6) above, in which the optical elements are wire grid polarizers.

(8) The image pickup device according to (7) above, in which the wire grid polarizers are formed using a single metallic material.

(9) The image pickup device according to (7) above, in which the wire grid polarizers are formed using a laminated film of a plurality of metallic materials.

(10) The image pickup device according to (7) above, in which the wire grid polarizers are formed using a laminated film of a plurality of metallic materials and an insulator material.

(11) The image pickup device according to any one of (1) to (6) above, in which the optical elements are color filters utilizing surface plasmon resonance.

(12) An image pickup device including:
photoelectric conversion units that convert incident light into electric signals;
optical elements that provide the incident light to the photoelectric conversion units; and
an underlying film of the optical elements provided in a light-shielding region outside an effective pixel region of the photoelectric conversion units in a layer between the optical elements and the photoelectric conversion units.

(13) An image pickup device including:
photoelectric conversion units that convert incident light into electric signals;
optical elements that provide the incident light to the photoelectric conversion units; and
an underlying film of the optical elements provided in a contact region outside an effective pixel region of the photoelectric conversion units in a layer between the optical elements and the photoelectric conversion units.

REFERENCE SIGNS LIST

10 Imaging device
11 Coupling lens

110 On-chip lens
120 Planarizing film
130 Polarizer
131 Metal layer
133 Antireflective layer
134 Insulator
135 Barrier metal
140 Light-shielding film
190 Plasmon filter
191 Silicon oxide film
192 Aluminum thin film
193 Glass substrate
200 Semiconductor substrate
210 Photodiode
220 Trench
300 Wiring layer
510 Effective pixel region
511 Open region
512 Inter-pixel frame
520 Light-shielding region
530 Contact region

The invention claimed is:

1. An image pickup device, comprising:
photoelectric conversion units configured to convert incident light into electric signals;
optical elements configured to provide the incident light to the photoelectric conversion units;
an underlying film of the optical elements, wherein
the underlying film is in a region between a first open region and a second open region of the optical elements,
the underlying film is in a layer between the optical elements and the photoelectric conversion units, and
the underlying film includes a barrier metal;
an inter-pixel frame that includes a metal layer; and
an insulator, wherein
the barrier metal is between the insulator and the metal layer, and
the barrier metal is in direct contact with the insulator and the metal layer.

2. The image pickup device according to claim 1, wherein the barrier metal of the underlying film includes a single metallic material.

3. The image pickup device according to claim 1, wherein the underlying film further includes a laminated metal film.

4. The image pickup device according to claim 1, wherein the underlying film is in a light-shielding region outside an effective pixel region of the photoelectric conversion units.

5. The image pickup device according to claim 1, wherein the underlying film is in a contact region outside an effective pixel region of the photoelectric conversion units.

6. The image pickup device according to claim 1, wherein the optical elements are wire grid polarizers.

7. The image pickup device according to claim 6, wherein the wire grid polarizers include a single metallic material.

8. The image pickup device according to claim 6, wherein the wire grid polarizers include a laminated film of a plurality of metallic materials.

9. The image pickup device according to claim 6, wherein the wire grid polarizers include a laminated film of a plurality of metallic materials and the insulator.

10. The image pickup device according to claim 1, wherein the optical elements are color filters utilizing surface plasmon resonance.

11. An image pickup device, comprising:
photoelectric conversion units configured to convert incident light into electric signals;
optical elements configured to provide the incident light to the photoelectric conversion units;
an underlying film of the optical elements, wherein
the underlying film is in a light-shielding region outside an effective pixel region of the photoelectric conversion units,
the underlying film is in a layer between the optical elements and the photoelectric conversion units, and
the underlying film includes a barrier metal;
an inter-pixel frame that includes a metal layer; and
an insulator, wherein
the barrier metal is between the insulator and the metal layer, and
the barrier metal is in direct contact with the insulator and the metal layer.

12. An image pickup device, comprising:
photoelectric conversion units configured to convert incident light into electric signals;
optical elements configured to provide the incident light to the photoelectric conversion units;
an underlying film of the optical elements, wherein
the underlying film is in a contact region outside an effective pixel region of the photoelectric conversion units,
the underlying film is in a layer between the optical elements and the photoelectric conversion units, and
the underlying film includes a barrier metal;
an inter-pixel frame that includes a metal layer; and
an insulator, wherein
the barrier metal is between the insulator and the metal layer, and
the barrier metal is in direct contact with the insulator and the metal layer.

* * * * *